United States Patent
Sakakibara et al.

(10) Patent No.: US 7,968,953 B2
(45) Date of Patent: Jun. 28, 2011

(54) SEMICONDUCTOR DEVICE INCLUDING SCHOTTKY BARRIER DIODE AND METHOD OF MANUFACTURING THE SAME

(75) Inventors: Jun Sakakibara, Anjo (JP); Hitoshi Yamaguchi, Nisshin (JP)

(73) Assignee: DENSO CORPORATION, Kariya (JP)

( * ) Notice: Subject to any disclaimer, the term of this patent is extended or adjusted under 35 U.S.C. 154(b) by 178 days.

(21) Appl. No.: 12/078,369

(22) Filed: Mar. 31, 2008

(65) Prior Publication Data

US 2008/0246096 A1 Oct. 9, 2008

(30) Foreign Application Priority Data

Apr. 3, 2007 (JP) ................................. 2007-097416

(51) Int. Cl.
*H01L 27/06* (2006.01)
(52) U.S. Cl. .......................... 257/401; 257/475; 257/328
(58) Field of Classification Search .................. 257/328, 257/339, 341, 342, 401, 92
See application file for complete search history.

(56) References Cited

U.S. PATENT DOCUMENTS

| | | | | |
|---|---|---|---|---|
| 5,545,905 | A * | 8/1996 | Muraoka et al. | 257/268 |
| 6,693,323 | B2 * | 2/2004 | Sato et al. | 257/341 |
| 2005/0156283 | A1 * | 7/2005 | Tokuda et al. | 257/622 |
| 2005/0258479 | A1 * | 11/2005 | Ono et al. | 257/328 |
| 2006/0237813 | A1 * | 10/2006 | Hshieh et al. | 257/475 |
| 2007/0120201 | A1 | 5/2007 | Yamaguchi et al. | |

FOREIGN PATENT DOCUMENTS

| | | |
|---|---|---|
| JP | A-2000-349304 | 12/2000 |
| JP | A-2002-076370 | 3/2002 |

* cited by examiner

*Primary Examiner* — Wai-Sing Louie
*Assistant Examiner* — Sue Tang
(74) *Attorney, Agent, or Firm* — Posz Law Group, PLC

(57) ABSTRACT

A semiconductor device includes a substrate, a plurality of first columns having a first conductivity type, a plurality of second columns having a second conductivity type, a first electrode, and a second electrode. The first columns and the second columns are alternately arranged on the substrate to provide a super junction structure. The first electrode is disposed on the super junction structure, forms schottky junctions with the first columns, and forms ohmic junctions with the second columns. The second electrode is disposed on the substrate on an opposite side of the super junction structure. At least a part of the substrate and the super junction structure has lattice defects to provide a lifetime control region at which a lifetime of a minority carrier is controlled to be short.

20 Claims, 11 Drawing Sheets

SEMICONDUCTOR DEVICE INCLUDING SCHOTTKY BARRIER DIODE AND METHOD OF MANUFACTURING THE SAME

CROSS REFERENCE TO RELATED APPLICATION

This application is based on Japanese Patent Application No. 2007-97416 filed on Apr. 3, 2007, the contents of which are incorporated herein by reference in their entirety.

BACKGROUND OF THE INVENTION

1. Field of the Invention

The present invention relates to a semiconductor device including a schottky barrier diode and a method of manufacturing the semiconductor device.

2. Description of the Related Art

Figure 19:
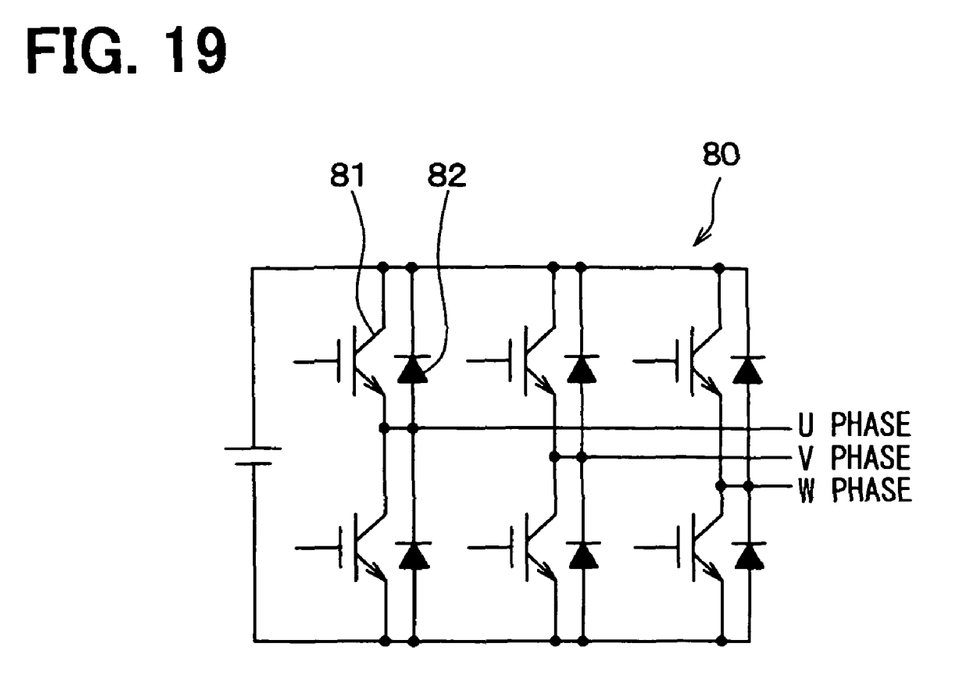
FIG. 19 is a circuit diagram showing an inverter circuit according to an example of the related art.

Conventionally, an inverter circuit is used for driving an alternate current diode with a high efficiency, for example. An inverter circuit 80 according to an example of the related art includes switching elements 81 and freewheeling diodes 82, as shown in FIG. 19. The switching elements 81 and the freewheeling diodes 82 are coupled in parallel for driving a motor (not shown) at three phases including a U-phase, a V-phase, and a W-phase.

For example, a low-loss insulated gate bipolar transistor (IGBT) may be used as the switching element 81, and a fast recovery diode (FRD) having a high reverse-recovering property may be used as the freewheeling diode 82. When the freewheeling diode 82 as the FRD is operated in a forward direction, a lifetime of a minority carrier is controlled to be short. While having a merit that reverse-recovering time is short, the freewheeling diode 82 has a demerit that a forward voltage $V_F$ becomes high and a flowing-back loss becomes large.

A schottky barrier diode (SBD) has a low forward voltage $V_F$ and a high reverse-recovering property. However, the SBD that has a silicon (Si) simple structure is difficult to resist an electric voltage over 200 V. Thus, a super junction SBD (SJ-SBD), in which a super junction structure and the SBD are combined, is used. In the SJ-SBD, the SJ structure has a PN diode, and the PN diode and the SBD are arranged in parallel. Thus, an electric current flowing to the PN diode is restricted for showing the high reverse-recovering property.

JP-2000-349304A and JP-2002-76370A respectively disclose a schottky barrier diode in which a positive (P) column that configurates the SJ structure is provided as a floating region. When a reverse bias is applied to the PN diode, the P column functions as a source of the minority carrier, and thereby the reverse-recovering property of the SJ-SBD is improved.

Figure 20A:
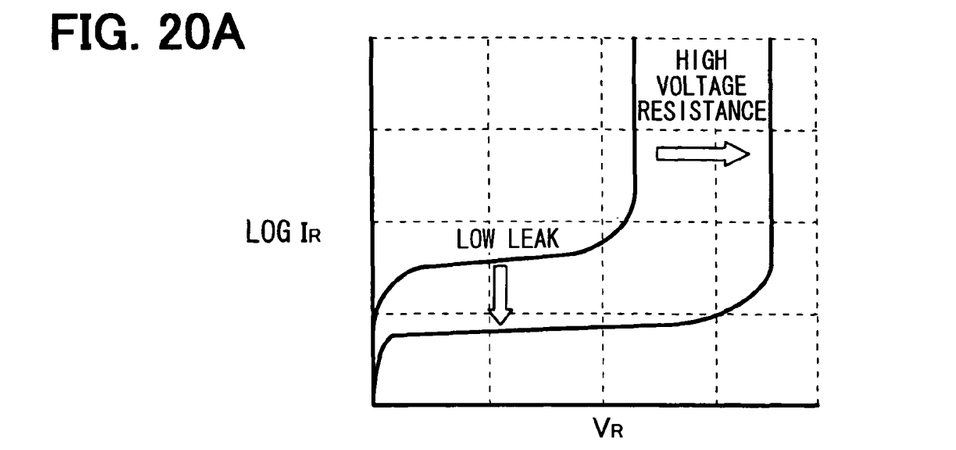
FIGS. 20A-20C are graphs showing a performance required for a freewheeling diode.
Figure 20B:
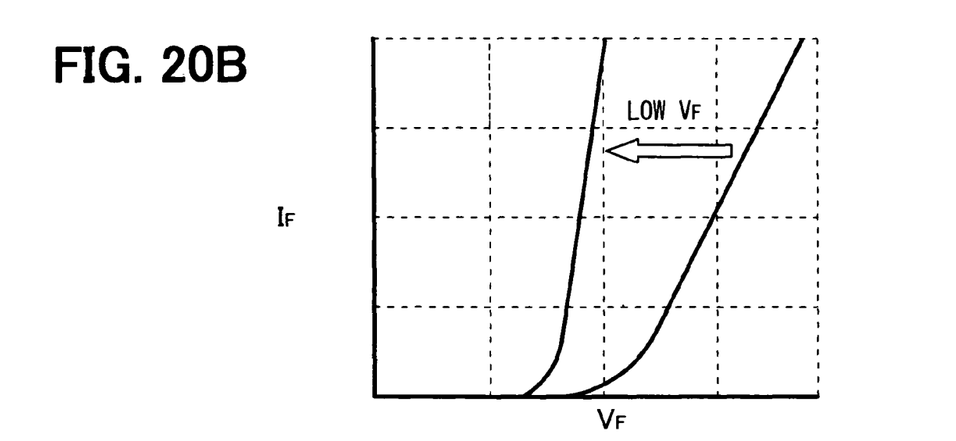
Figure 20C:
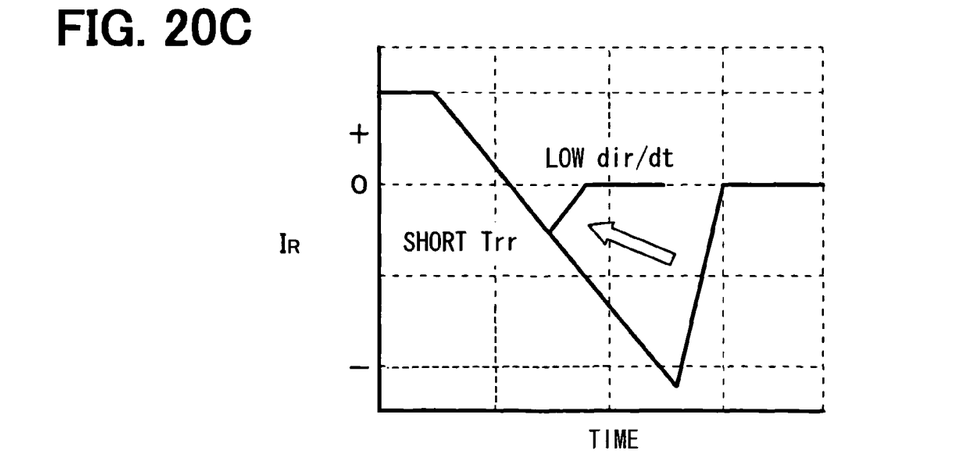

However, the floating state of the P column has a possibility of causing a variation in performance and a deterioration of a reliability of the freewheeling diode. A performance required for the freewheeling diode is shown in FIGS. 20A-20C. Regarding to a reverse property shown in FIG. 20A, it is preferred that a leak electric current $I_R$ is low and a voltage resistance $V_R$ is high. Regarding to a forward property shown in FIG. 20B, it is preferred that a forward voltage $V_F$ is low. Regarding to a reverse-recovering property shown in FIG. 20C, it is preferred that a reverse-recovering time Trr is short and a reverse electric current $I_R$ is low.

However, when a forward voltage $V_F$ of the PN diode is low, a through current and a reverse-recovering property are reduced. Thus, the forward voltage $V_F$ and the reverse-recovering property have a trade-off relation and it is difficult to ensure compatibility between the forward voltage $V_F$ and the reverse-recovering property.

In addition, when the SBD is configured to have a high voltage resistance, the forward voltage $V_F$ is required to be high and a flowing-back loss is difficult to be reduced. Thus, the forward voltage $V_F$ and the voltage resistance of the diode have a trade-off relation and it is difficult to ensure compatibility between the forward voltage $V_F$ and the voltage resistance.

Therefore, it is difficult to ensure all of reducing the forward voltage $V_F$, increasing the voltage resistance, and improving the reverse-recovering property.

SUMMARY OF THE INVENTION

In view of the foregoing problems, it is an object of the present invention to provide a semiconductor device including a schottky barrier diode, and another object of the invention is to provide a method of manufacturing the semiconductor device.

According to a first aspect of the invention, a semiconductor device includes a substrate, a plurality of first columns, a plurality of second columns, a first electrode, and a second electrode. The substrate and the first columns have a first conductivity type and the second columns have a second conductivity type. The first columns and the second columns are alternately arranged on the substrate in a planar direction of the substrate to configurate a super junction structure. The first electrode is disposed on the super junction structure, forms schottky junctions with the first columns, and forms ohmic junctions with the second columns. The second electrode is disposed on the substrate on an opposite side of the super junction structure. The first columns and the second columns provide diodes, and the first electrode and the first columns provide schottky barrier diodes. The diodes and the schottky barrier diodes are coupled in parallel between the first electrode and the second electrode. At least a part of the substrate and the super junction structure has lattice defects to provide a lifetime control region at which a lifetime of a minority carrier is controlled to be short.

In a present semiconductor device, the schottky barrier diodes are provided in the super junction structure. Thus, a resistance of a current path between the first electrode and the second electrode is reduced. In addition, because the semiconductor device has the super junction structure, a concentration of an electric field is restricted. Thus, the semiconductor device has a high voltage resistance. Furthermore, the lifetime of the minority carrier becomes short at the lifetime control region, and thereby a reverse-recovering time becomes short and a reverse current is reduced. As a result, a reverse-recovering property of the semiconductor device can be improved.

According to a second aspect of the invention, a method of manufacturing a semiconductor device includes: preparing a substrate having a first conductivity type; forming a plurality of trenches on a first surface of the substrate to provide a plurality of first columns that is separated from each other through the plurality of trenches; forming a plurality of second columns having a second conductivity type in the plurality of trenches; forming a first electrode on the plurality first columns and the plurality of second columns in such a manner that the first electrode forms schottky junctions with the plurality of first columns and forms ohmic junctions with the plurality of second columns; implanting ions to a second surface of the substrate to form a layer that has the first conductivity type and that has a high impurity concentration with respect the substrate; forming lattice defects at least at a part of the layer, the substrate, the plurality of first columns, and the plurality of second columns to provide a lifetime control region at which a lifetime of a minority carrier is controlled to be short; and forming a second electrode on the layer.

In the semiconductor device manufactured by the above-described method, the plurality of first columns and the plurality of second columns configurate a super junction structure, and the first electrode and the plurality of first columns provide schottky barrier diodes in the super junction structure. Thus, a resistance of a current path between the first electrode and the second electrode is reduced. In addition, because the semiconductor device has the super junction structure, a concentration of an electric field is restricted. Thus, the semiconductor device has a high voltage resistance. Furthermore, the lifetime of the minority carrier becomes short at the lifetime control region, and thereby a reverse-recovering time becomes short and a reverse current is reduced. As a result, a reverse-recovering property of the semiconductor device can be improved.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

A semiconductor device according to a first embodiment of the invention will be described with reference to FIGS. 1-5.

The semiconductor device has a super junction structure (SJ structure) including an N+ type substrate 10, N type regions (N column) 20 each having a column shape and P type regions (P column) 30 each having a column shape. On the N+ type substrate 10, the N columns 20 and the P columns 30 are alternately arranged in a plane direction of the N+ type substrate 10. That is, the semiconductor device shown in FIG. 1 has a repetition structure in which the N columns 20 and the P columns 30 are alternately arranged.

For example, the N+ type substrate 10 has an impurity concentration in a range from about $1 \times 10^{18}$ cm$^{-3}$ to about $1 \times 10^{20}$ cm$^{-3}$. Each of PN columns that includes the N column 20 and the P column 30 has an impurity concentration in a range from about $1 \times 10^{15}$ cm$^{-3}$ to about $1 \times 10^{18}$ cm$^{-3}$, a width in a range from about 0.1 μm to about 10 μm, a depth in a range from about 1 μm to about 100 μm, and an aspect ratio greater than or equal to 1.

Figure 1:
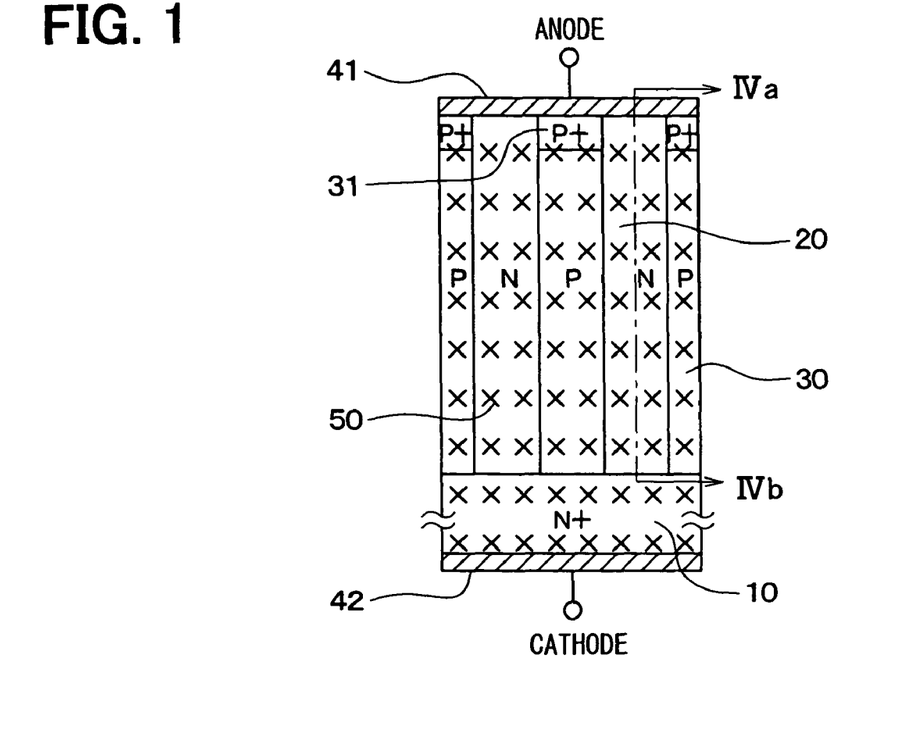
FIG. 1 is a schematic cross-sectional view showing a semiconductor device according to a first embodiment of the invention.

Each of the P columns 30 has a P+ type region 31 at a surface portion thereof. The P+ type region 31 has a high impurity concentration with respect to the P columns 30. In addition, an anode electrode 41 is formed on the N columns 20 and the P+ type regions 31. In the present case, the N columns 20 and the anode electrode 41 form schottky junctions and configurate schottky barrier diodes (SBD). The P+ type regions 31 and the anode electrode 41 form ohmic junctions. In contrast, a cathode electrode 42 is disposed on the N+ type substrate 10 on an opposite side of the SJ structure. In the present embodiment, the anode electrode 41 corresponds to a first electrode, and the cathode electrode 42 corresponds to a second electrode. Furthermore, an N type, an N− type, and an N+ type correspond to a first conductivity type, and a P type and a P+ type correspond to a second conductivity type.

In the present semiconductor device, the whole region of the N columns 20, the P columns 30, and the P+ type regions 31, which configurate the SJ structure, and the N+ type substrate 10 is configured to function as a lifetime control region 50. The lifetime control region 50 is provided so that a lifetime of a minority carrier becomes short in the SJ structure. For example, lattice defects is formed in the whole SJ structure by irradiating with a radiation from a rear surface of the N+ type substrate 10, and thereby the lifetime control region 50 is provided. As the radiation, an electron beam and a neutron beam may be used, for example.

An exemplary method of manufacturing the semiconductor device will now be described. First, an N type substrate is prepared and trenches are formed on a front surface side of the N type substrate with a predetermined interval. Thereby, the N columns 20 that are separated from each other through the trenches are provided. Then, the P columns 30 are formed in the trenches. Thereby, the SJ structure, in which the N columns 20 and the P columns 30 are alternately arranged, is provided. After planarizing the surface of the N type substrate, an ion implantation is selectively performed to the surface portions of the P columns 30 to form the P+ type regions 31. Then, the anode electrode 41 is formed on the N columns 20 and P+ type regions 31.

A rear surface of the N type substrate is thinned, and another ion implantation is performed on the rear surface of the N type substrate to form a N+ type layer that has a high impurity concentration with respect to the N type substrate. The N+ type layer corresponds to the N+ type substrate 10 shown in FIG. 1.

Then, the whole SJ structure is irradiated with the radiation, such as an electron beam and a neutron beam, and lattice defects are formed in the whole SJ structure. In the present case, the lifetime of minority carriers is controlled by controlling a trap density by the lattice defects.

Figure 2:
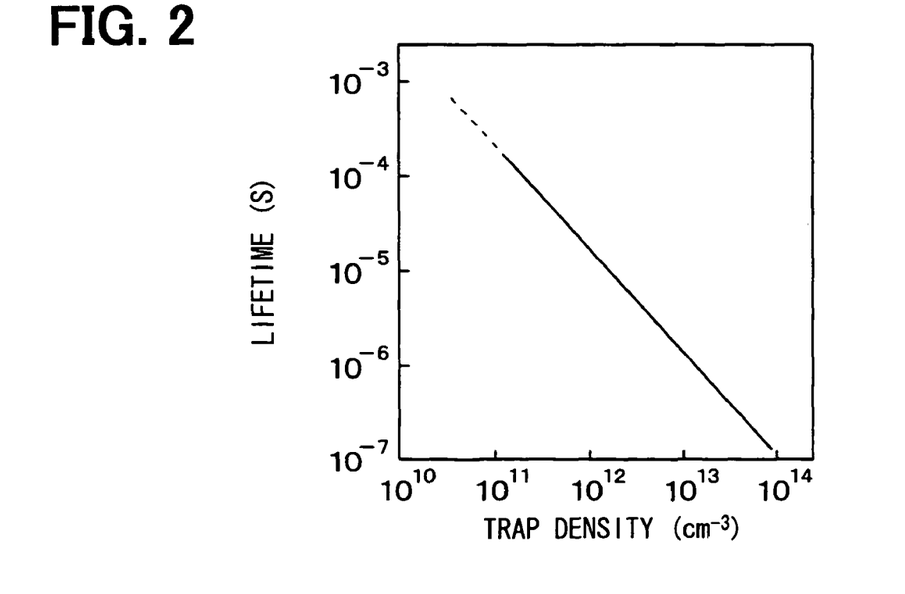
FIG. 2 is a graph showing a relationship between a trap density and a lifetime.

As shown in FIG. 2, the lifetime becomes short when the trap density becomes large. By irradiating the SJ structure with the radiation, the lifetime is controlled to be in a range from about $1/10$ to about $1/100$ with respect to a case where the SJ structure is not irradiated with the radiation.

Specifically, in the relation shown in FIG. 2, a target trap density is acquired from a target value of the lifetime, and the SJ structure is irradiated with the radiation from a side of the N+ type substrate 10 so that the trap density approaches the target trap density. When the SJ structure is not irradiated, the lifetime is about $10^{-5}$ s, for example. However, when the SJ structure is irradiated with the radiation, the trap density on the SJ structure increases, and thereby the lifetime becomes less than or equal to $10^{-5}$ s.

Furthermore, the cathode electrode 42 is formed on the N+ type substrate 10 to form the semiconductor device shown in FIG. 1.

Figure 3:
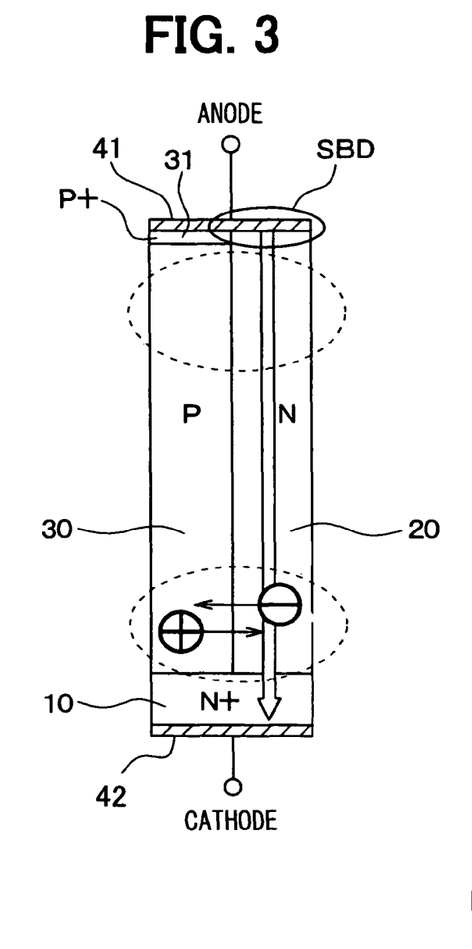
FIG. 3 is a schematic diagram showing a PN column in a super junction structure.

An operation of the semiconductor device manufactured by the above-described method will now be described with reference to FIG. 3. One of the PN columns in the SJ structure is shown in FIG. 3. First, a forward voltage is applied to the anode electrode 41, and the cathode electrode 42 is connected to a ground. Most of a forward current (SBD current component) flows through the schottky barrier diode (SBD) that is constructed with the anode electrode 41 and the N column 20, as shown by the arrow in FIG. 3, and flows to the ground through the cathode electrode 42.

A part of the forward current flowing between the anode electrode 41 and the cathode electrode 42 flows through the P+ type region 31 and the P column 30 and flows from a portion of the P column 30 adjacent to the N+ type substrate 10 to the N column 20.

In a portion of the PN column on a side of the anode electrode 41, an electric potential is high. Thus, there is no difference in the electric potential between the N column 20 and the P column 30, and a carrier injection is difficult to occur between the P column 30 and the N column 20. Thus, the portion of the PN column on the side of the anode electrode 41 does not function as a parasitic PN diode. However, because the SBD current component flows through the N column 20, a potential gradient is provided in the N column 20. Thereby, a portion of the N column 20 on the side of the N+ type substrate 10 has a lower electric potential compared with a portion of the P column 30 on the side of N+ type substrate 10. Thus, the difference of electric potential between the N column 20 and the P column 30 becomes largest in a portion of the PN column on the side of the cathode electrode 42, that is, in a bottom portion of the SJ structure. As a result, electrons (majority carrier) of the N column 20 moves to the P column 30, and holes (minority carrier) of the P column 30 moves to the N column 20, and thereby the carrier injection occurs between the N column 20 and the P column 30. Thus, the bottom portion of the SJ structure functions as the parasitic PN diode.

When a reverse bias is applied to the semiconductor device, a reverse current flows through the parasitic PN diode located at the bottom portion of the SJ structure. However, the whole SJ structure, that is, at least the bottom portion of the SJ structure is formed as the lifetime control region 50. Thus, the lifetime of the minority carrier in the N column 20 and the P column 30 becomes short and the reverse current is reduced due to the lifetime control region 50. Thereby, the reverse-recovering property of the semiconductor device can be improved.

The lifetime control region 50 can restrict the operation of the parasitic PN diode provided due to the SJ structure without affecting the operation of the SBD constructed with the anode electrode 41 and the N column 20. Even if the N+ type substrate 10 is formed as the lifetime control region 50, the operation of the SBD is not affected.

Figure 4:
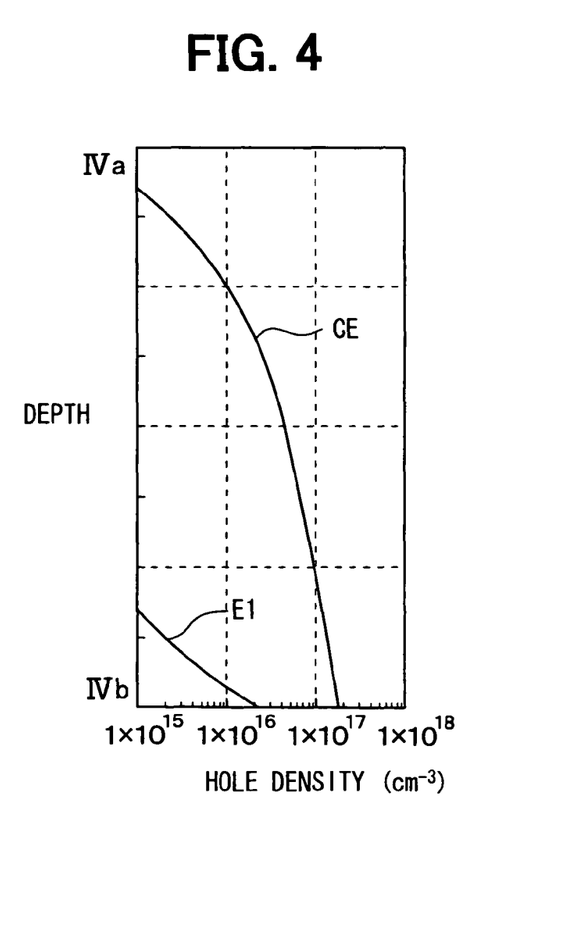
FIG. 4 is a graph showing a distribution of a minority carrier in an N column taken along line IVa-IVb in FIG. 1.

A simulation of a distribution of the minority carrier in a case where the forward voltage is applied to the semiconductor device is performed by the inventors. In a result of the simulation shown in FIG. 4, a hole density, that is, a density of the minority carrier in the N column 20 is compared between the semiconductor device according to the first embodiment (E1) and a semiconductor device according to a comparative example (CE). In the semiconductor device according to the comparative example, the lifetime control region 50 is not provided. As shown in FIG. 4, the hole density in the N column 20 in the semiconductor device according to the first embodiment (E1) is reduced compared with that of the comparative example (CE). Thus, the injection of the minority carrier to the N column 20 is restricted in the semiconductor device according to the first embodiment (E1).

Figure 5:
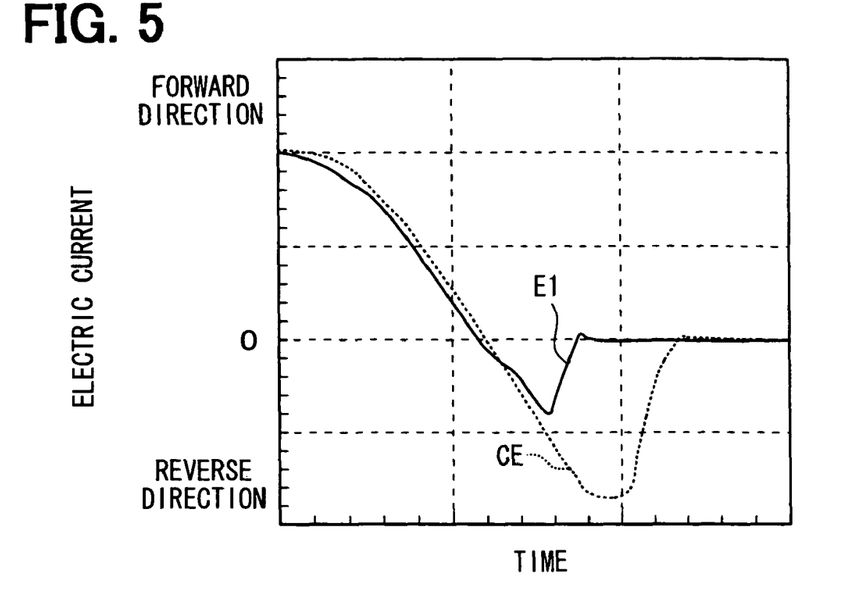
FIG. 5 is a graph showing a simulation result of reverse-recovering properties of the semiconductor device according to the first embodiment (E1) and a semiconductor device according to a comparative example (CE)

In addition, a simulation of the reverse-recovering properties of the semiconductor device according to the first embodiment (E1) and the semiconductor device according to the comparative example (CE) is performed by the inventors. As shown in FIG. 5, a reverse-recovering current and a reverse-recovering time of the semiconductor device according to the first embodiment (E1) are reduced compared with the comparative example (CE), due to the restriction of the injection of the minority carrier to the N column 20.

In the semiconductor device according to the first embodiment, the SBDs are provided in the SJ structure. Thereby, an energizing path is provided between the anode electrode 41 and the cathode electrode 42 in a vertical direction, and a resistance becomes low. Furthermore, because the N columns 20 and the P columns 30 are arranged alternately, a depletion layer spreads throughout interfaces between the N columns 20 and the P columns 30. Thus, an electric field is restricted from concentrating at a specific area. As a result, a field strength between the anode electrode 41 and the cathode electrode 42 becomes uniform, and the high voltage resistance is provided.

In addition, the lattice defects are provided at the whole SJ structure, and a region at which the lattice defects are provided functions as the lifetime control region 50. Thus, even when the electric current flows through the N column 20 and the potential gradient generated in the N column 20 and a large potential difference is generated at the bottom portion of the SJ structure, the lifetime of the minority carrier and the reverse current in the parasitic PN diode provided in the SJ structure are reduced due to the lifetime control region 50. Therefore, the reverse-recovering property of the semiconductor device can be improved.

Second Embodiment

In the semiconductor device shown in FIG. 1, the whole SJ structure is formed as the lifetime control region 50. Alternatively, only the bottom portion of the SJ structure, at which the parasitic PN diode is provided, may be formed as the lifetime control region 50. Also in the present case, the reverse-recovering property can be improved.

Figure 6:
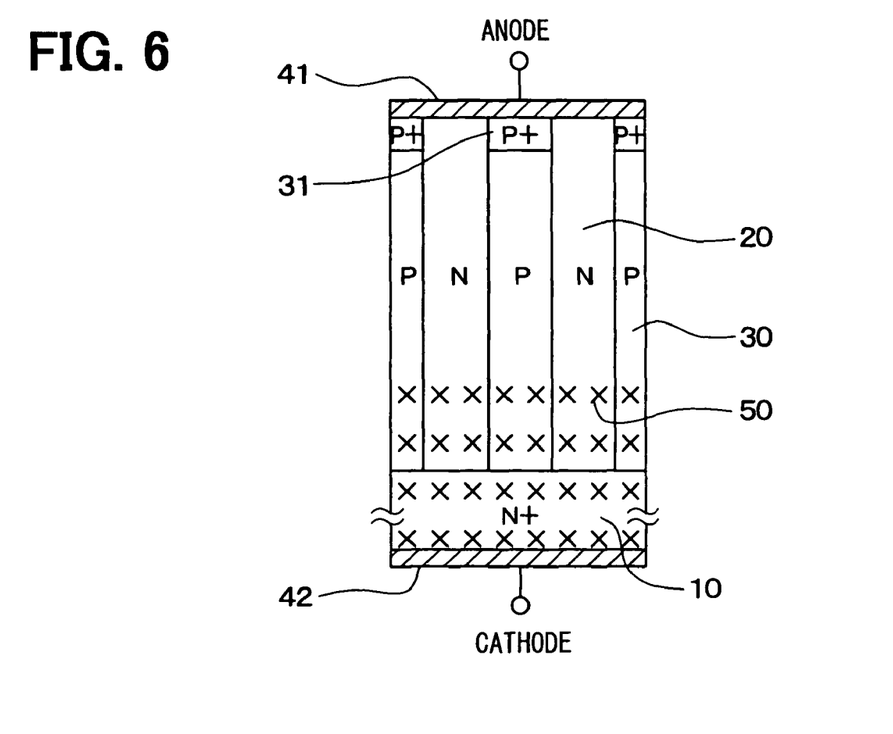
FIG. 6 is a schematic cross-sectional view showing a semiconductor device according to a second embodiment of the invention.

In a semiconductor device according to a second embodiment of the invention, only a portion of the SJ structure on the side of the N+ type substrate 10, that is, only the bottom portion of the SJ structure is formed as the lifetime control region 50, as shown in FIG. 6. Other part of the semiconductor device shown in FIG. 6 is almost similar to the semiconductor device shown in FIG. 1.

In the present case, after forming the SJ structure on the N+ type substrate 10, for example, helium ion is irradiated from a side of the N+ type substrate 10 toward a side of the SJ structure, and thereby the lifetime control region 50 is provided at only the bottom portion of the SJ structure.

When the lifetime control region 50 is provided in the whole SJ structure, the lattice defects may be formed also at PN junction portions, and the lattice defects may cause a leak current. In contrast, when the lifetime control region 50 is provided only at the bottom portion of the SJ structure, the lattice defects are formed only at the bottom portion. Thus, the leak current is reduced.

Third Embodiment

Figure 7:
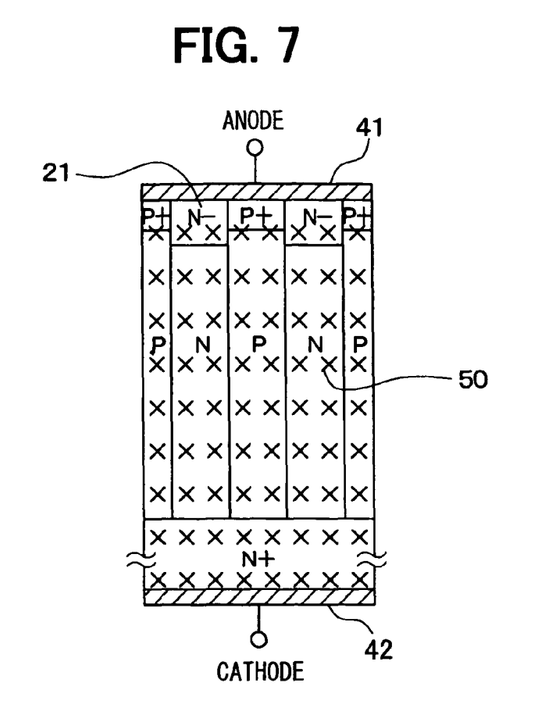
FIG. 7 is a schematic cross-sectional view showing a semiconductor device according to a third embodiment of the invention.

In a semiconductor device according to a third embodiment of the invention, each of the N columns 20 has an N− type region 21 at a surface portion thereof, as shown in FIG. 7. Each of the N− type regions 21 has a low impurity concentration compared with each of the N columns 20. For example, the N− type region 21 has an impurity concentration in a range from about $1\times10^{14}$ cm$^{-3}$ to about $1\times10^{17}$ cm$^{-3}$.

Other part of the semiconductor device shown in FIG. 7 is almost similar to the semiconductor device shown in FIG. 1. In the present case, the lifetime control region 50 is provided at the whole SJ structure. Thus, a low resistance, a high voltage resistance, and a high reverse-recovering property can be obtained.

Fourth Embodiment

Figure 8:
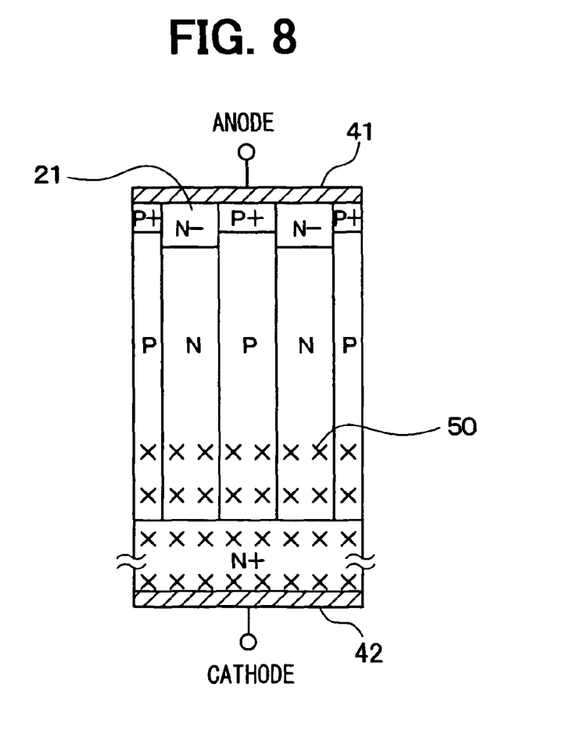
FIG. 8 is a schematic cross-sectional view showing a semiconductor device according to a fourth embodiment of the invention.

In a semiconductor device according to a fourth embodiment of the invention, the lifetime control region 50 is provided only at the bottom portion of the SJ structure, as shown in FIG. 8. Other part of the semiconductor device shown in FIG. 8 is almost similar to the semiconductor device shown in FIG. 7. Also in the present case, a low resistance, a high voltage resistance, and a high reverse-recovering property can be obtained. Furthermore, the leak current is reduced.

Fifth Embodiment

In the above-described first to fourth embodiments, the SJ structure is directly formed on the N+ type substrate 10. Alternatively, an N− type layer having a different impurity concentration may be formed between the N+ type substrate 10 and the SJ structure, to provide a semi SJ structure.

Figure 9:
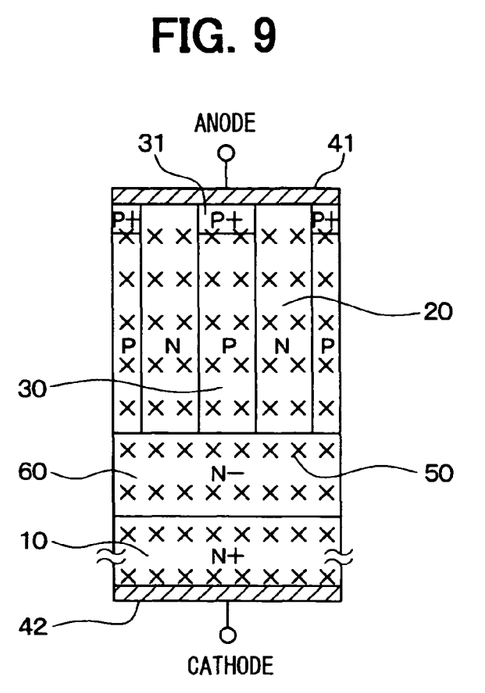
FIG. 9 is a schematic cross-sectional view showing a semiconductor device according to a fifth embodiment of the invention.

In a semiconductor device according to a fifth embodiment of the invention, an N− type layer 60 is provided between the N+ type substrate 10 and the SJ structure. The N− type structure has a low impurity concentration with respect to the N+ type substrate 10. Thus, the N− type layer 60 and the SJ structure configurate a semi SJ structure. The impurity concentration of the N− type layer 60 is less than or equal to the impurity concentration of the N column 20. For example, the N− type layer 60 has the impurity concentration in a ranged from about $1\times10^{14}$ cm$^{-3}$ to about $1\times10^{18}$ cm$^{-3}$. In the present case, the whole semi SJ structure is formed as the lifetime control region 50. Other part of the semiconductor device shown in FIG. 9 is almost similar to the semiconductor device shown in FIG. 1.

In the present case, after the SJ structure is formed on the N type substrate, N− type layer 60 and the N+ type substrate 10 are formed, and then, the radiation is irradiated from the side of the N+ type substrate 10. Thereby, the lifetime control region 50 is provided at the whole semi SJ structure.

When the N− type layer 60 is formed on the N+ type substrate 10 to configurate the semi SJ structure, a hole concentration becomes high in the N− type layer 60. Thus, a soft recovering property can be obtained.

Sixth Embodiment

Figure 10:
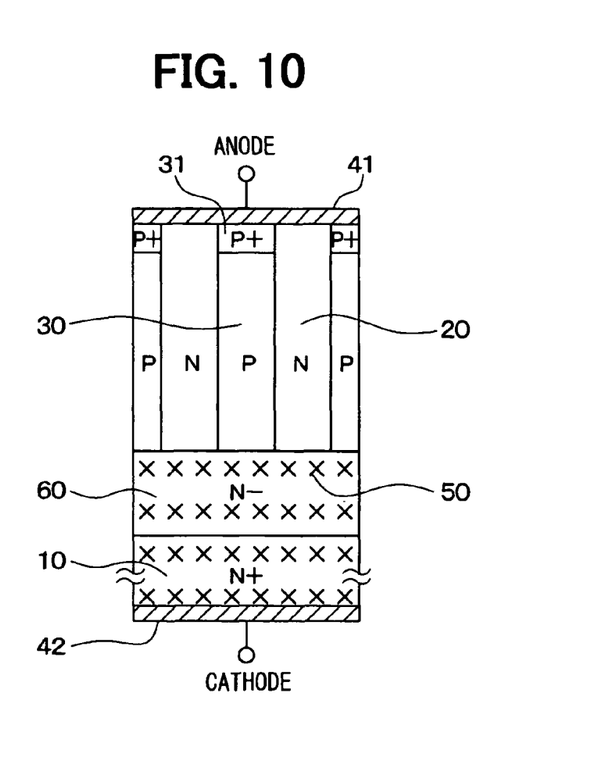
FIG. 10 is a schematic cross-sectional view showing a semiconductor device according to a sixth embodiment of the invention.

In a semiconductor device according to a sixth embodiment of the invention, the N− type layer 60 is provided between the N+ type substrate 10 and the SJ structure, and only the N− type layer 60 is formed as the lifetime control region 50, as shown in FIG. 10. Other part of the semiconductor device shown in FIG. 10 is almost similar to the semiconductor device shown in FIG. 9.

Seventh Embodiment

Figure 11:
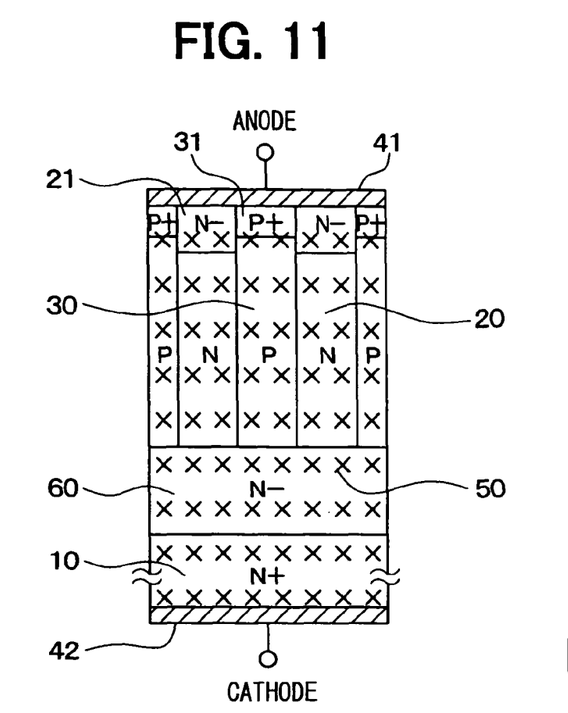
FIG. 11 is a schematic cross-sectional view showing a semiconductor device according to a seventh embodiment of the invention.

In a semiconductor device according to a seventh embodiment of the invention, each of the N columns 20 has the N− type region 21 at the surface portion thereof, as shown in FIG. 11. Other part of the semiconductor device shown in FIG. 11 is almost similar to the semiconductor device shown in FIG. 9. In the present case, the whole semi SJ structure including the N− type region 21 is formed as the lifetime control region 50.

Eighth Embodiment

Figure 12:
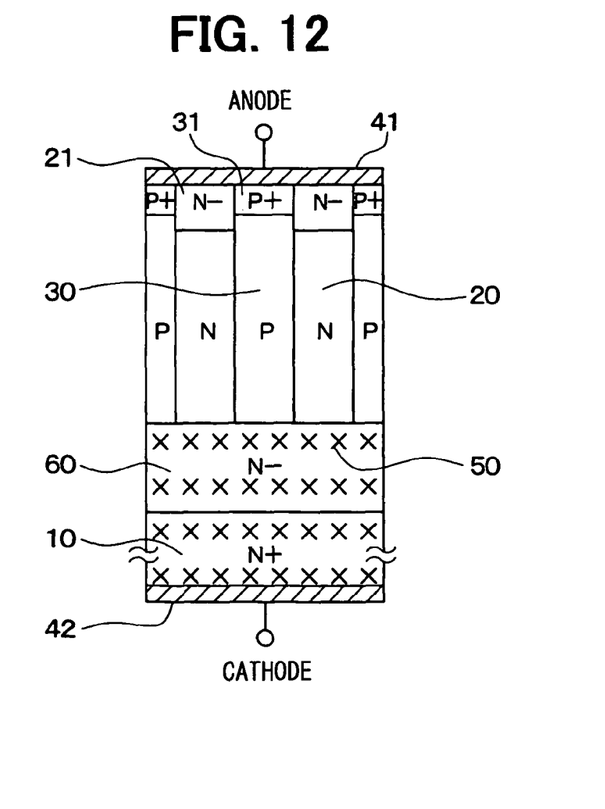
FIG. 12 is a schematic cross-sectional view showing a semiconductor device according to an eighth embodiment of the invention.

In a semiconductor device according to an eighth embodiment, each of the N columns 20 has the N− type region 21 at the surface portion thereof, as shown in FIG. 12. In the present case, only the N− type layer 60 is formed as the lifetime control region 50. Other part of the semiconductor device shown in FIG. 12 is almost similar to the semiconductor device shown in FIG. 11.

Ninth Embodiment

In the above-described first to eighth embodiments, the semiconductor device includes only the SBDs. Alternatively, the semiconductor device may include the SBDs and a metal-oxide-semiconductor (MOS) transistor.

Figure 13:
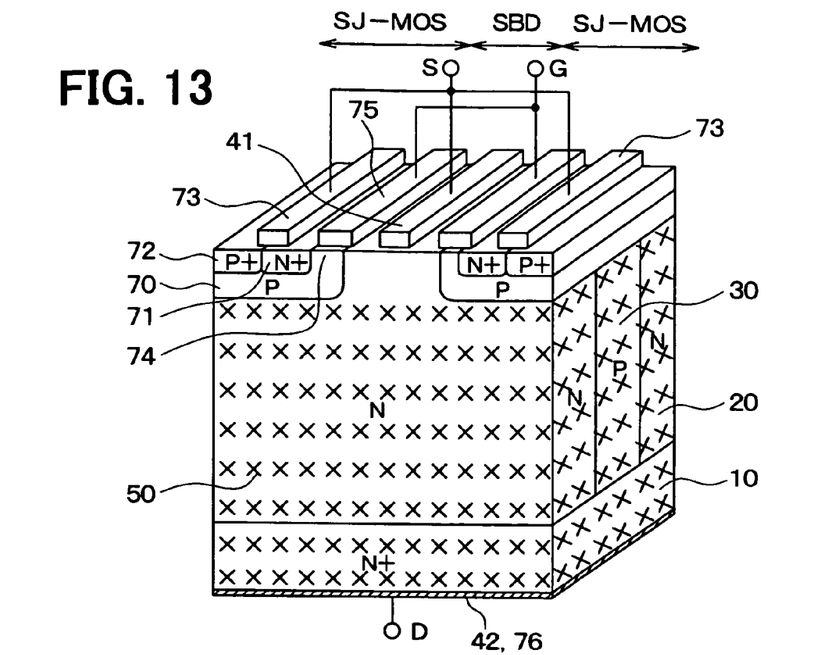
FIG. 13 is a schematic perspective view showing a semiconductor device according to a ninth embodiment of the invention.

As shown in FIG. 13, a semiconductor device according to a ninth embodiment of the invention has the SJ structure on the N+ type substrate 10. The SJ structure includes the N columns 20 and the P columns 30 that are alternately arranged in the repeating direction. In addition, the SJ structure includes P type base regions 70 disposed at the surface portion of the N columns 20 and the P columns 30. The P type base regions 70 extend in the repeating direction and are separated from each other. Each of the P type base regions 70 has a first section, a second section, and a third section at a surface portion thereof.

In each of the surface portions of the P type base regions 70, an N+ type source region 71 is disposed at the first section, and a P+ type body region 72 is disposed at the second section. Because an exemplary structure shown in FIG. 13 is repeated, the N+ type source regions 71 are arranged between the P+ type body regions 72. On a part of the N+ type source region 71 and the P+ type body region 72, a source electrode 73 is disposed. That is, the source electrode 73 includes a first part and a second part, and the first part is located on the N+ source region 71 and the second part is located on the P+ type body region 72.

Each of the third sections of the P type base regions 70 is located between the N+ type source region 71 and the N column 20 and functions as a channel region 74. On each of the channel regions 74, a gate electrode 75 is disposed.

On an upper surface of the SJ structure located between the separated P type base regions 70, the anode electrode 41 of the SBDs is disposed. The anode electrode 41 is coupled with a source of the MOS transistor. In addition, a drain electrode 76 is formed on the N+ type substrate 10 on an opposite side of the SJ structure. The drain electrode 76 also functions as the cathode electrode 42 of the SBDs.

Thus, in the SJ structure, portions at which the P type base regions 70 are formed function as the MOS transistor, and coupling portions of the anode electrode 41 and the N columns 20 located between the MOS transistor functions as the SBDs.

In the semiconductor device shown in FIG. 13, for example, an insulating layer (not shown) is formed on the source electrodes 73 and the anode electrode 41 for protecting the electrodes.

In the present semiconductor device, the SBDs are coupled between the source electrodes 73 and the drain electrode 76. Furthermore, the parasitic PN diode constructed with the N columns 20 and the P columns 30 is also coupled between the source electrodes 73 and the drain electrode 76.

In the present case, the whole SJ structure is formed as the lifetime control region 50. Because a performance of the MOS transistor is decided by the majority carrier, even when the lifetime of the diodes is controlled, the MOS transistor is less affected.

When the SBDs and the MOS transistor are integrally formed in the SJ structure, the semiconductor device can ensure a low resistance, a high voltage resistance and a high reverse-recovering property.

Tenth Embodiment

Figure 14:
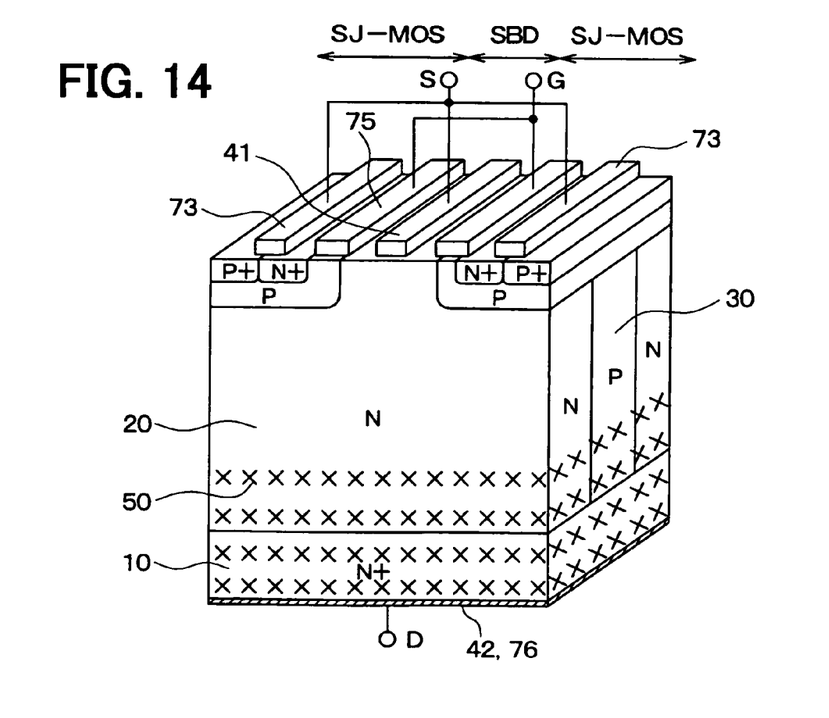
FIG. 14 is a schematic perspective view showing a semiconductor device according to a tenth embodiment of the invention.

In a semiconductor device according to a tenth embodiment of the invention, only a bottom portion of the SJ structure is formed as the lifetime control region 50, as shown in FIG. 14. Other part of the semiconductor device shown in FIG. 14 is almost similar to the semiconductor device shown in FIG. 13. In the present case, the reverse-recovering property in the parasitic PN diode provided at the bottom portion of the SJ structure can be improved.

Eleventh Embodiment

Figure 15:
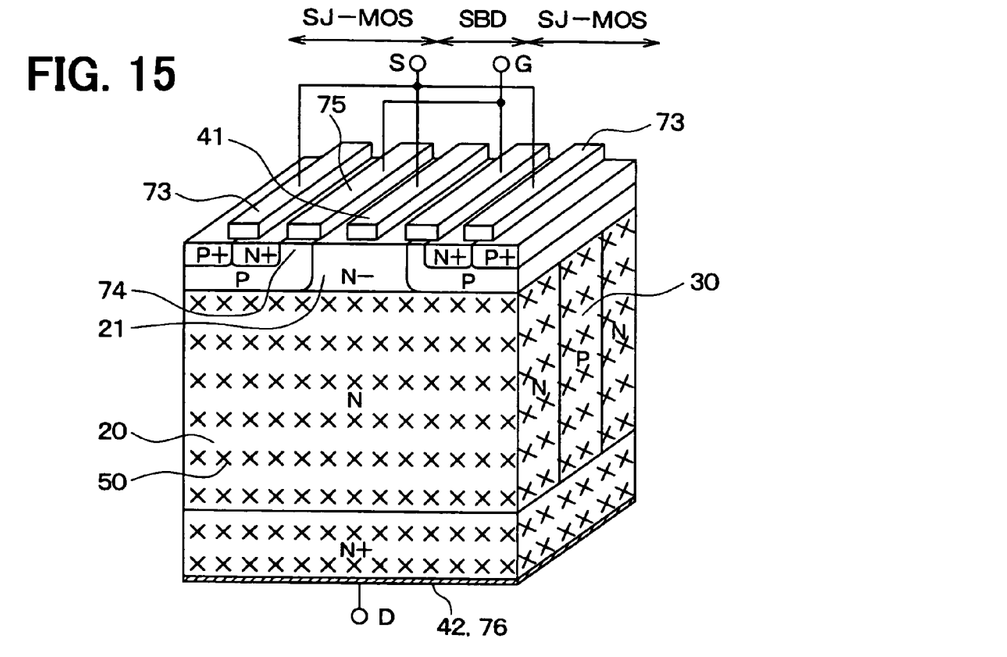
FIG. 15 is a schematic perspective view showing a semiconductor device according to a eleventh embodiment of the invention.

In a semiconductor device according to an eleventh embodiment of the invention, each of the N columns 20 has the N− type region 21 at the surface portion thereof, as shown in FIG. 15. Other part of the semiconductor device shown in FIG. 15 is almost similar to the semiconductor device shown in FIG. 13. The N− type regions 21 in FIG. 15 are almost similar to the N− type regions 21 shown in FIGS. 7, 8, 11, and 12.

The lattice defects are formed in the whole SJ structure including the N− type regions 21, and thereby the whole SJ structure functions as the lifetime control region 50.

Twelfth Embodiment

Figure 16:
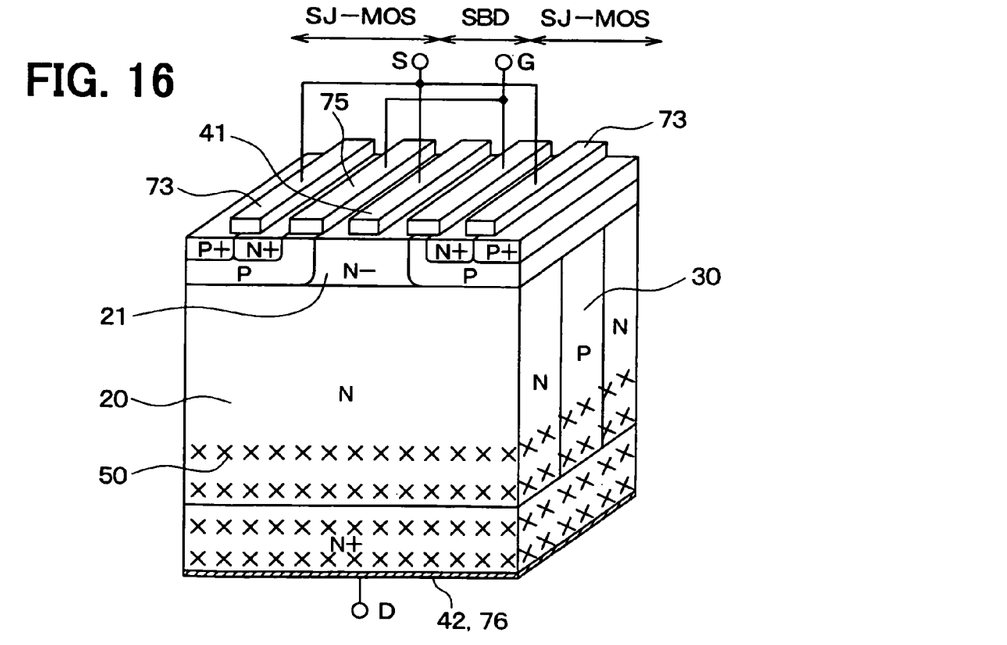
FIG. 16 is a schematic perspective view showing a semiconductor device according to a twelfth embodiment of the invention.

In a semiconductor device according to a twelfth embodiment of the invention, each of the N columns 20 has the N− type region 21 at the surface portion thereof, as shown in FIG. 16. In the present case, only the bottom portion of the SJ structure is formed as the lifetime control region 50. Other part of the semiconductor device shown in FIG. 16 is almost similar to the semiconductor device shown in FIG. 15.

Thirteenth Embodiment

Figure 17:
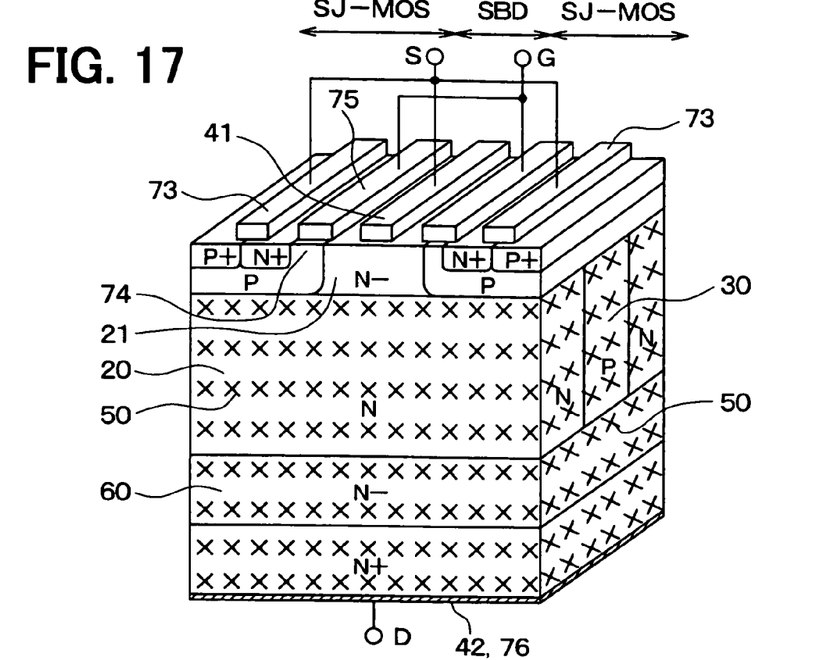
FIG. 17 is a schematic perspective view showing a semiconductor device according to a thirteenth embodiment of the invention.

In a semiconductor device according to a thirteenth embodiment of the invention, the N− type layer 60 is formed between the N+ type substrate 10 and the SJ structure, as shown in FIG. 17. In addition, each of the N columns 20 has the N− type region 21 at the surface portion thereof. In the present case, the lattice defects are formed in the whole semi SJ structure, and thereby the whole semi SJ structure functions as the lifetime control region 50.

Other part of the semiconductor device shown in FIG. 17 is almost similar to the semiconductor device shown in FIG. 15.

Fourteenth Embodiment

Figure 18:
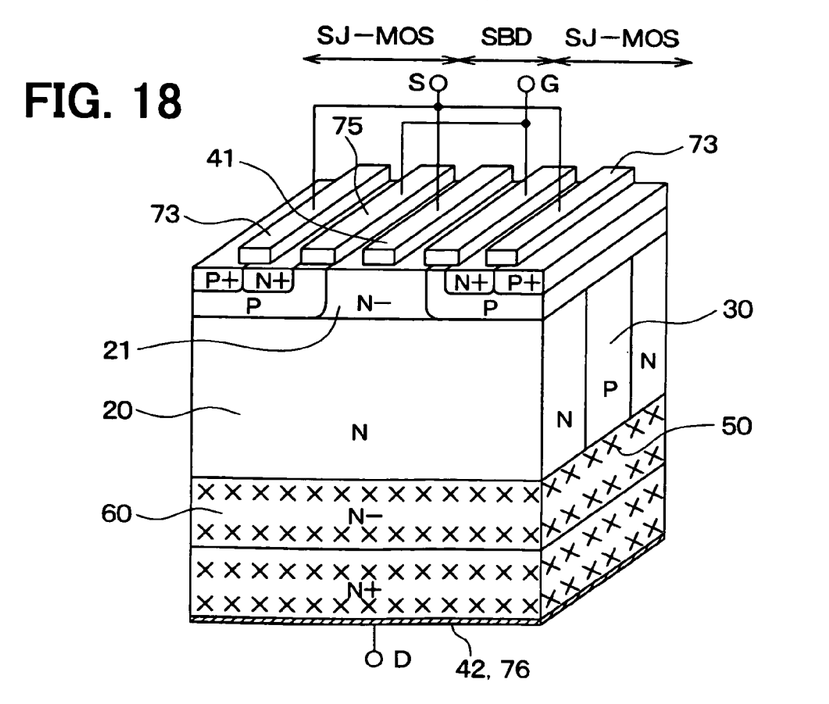
FIG. 18 is a schematic perspective view showing a semiconductor device according to a fourteenth embodiment of the invention.

In a semiconductor device according to a fourteenth embodiment of the invention, only the N− type layer 60 is formed as the lifetime control region 50, as shown in FIG. 18. Other part of the semiconductor device shown in FIG. 18 is almost similar to the semiconductor device shown in FIG. 17.

Other Embodiments

In the above-described embodiments, each of the conductivity types of N type and P type may be reversed.

In the above-described embodiments, each of the P columns 30 has the P+ type region 31 at the surface portion thereof. Alternatively, the P+ type regions 31 may be not formed at the P columns 30.

In the above-described embodiments, the lifetime control region 50 is formed by irradiating the PN columns with the radiation. Alternatively, the lifetime control region 50 may be formed by irradiating the PN columns with an ion beam. In the present case, proton and helium may be used as the ion beam.

The lattice defects provided at the lifetime control region 50 may distribute in a direction approximately perpendicular to the planar direction of the N+ type substrate 10. In the present case, the lifetime of the minority carrier is controlled locally without increasing the leak current. The density of the lattice defects may have a peak in the SJ structure on a side of the N+ type substrate 10. In the present case, the lifetime of the minority carrier is controlled effectively at a portion of the SJ structure where the carrier injection is easy to occur.

The lifetime control region 50 may be provided at a portion of the SJ structure adjacent to the N+ type substrate 10. Also in the present case, the lifetime of the minority carrier is controlled effectively at a portion of the SJ structure where the carrier injection is easy to occur.

Alternatively, the density of the lattice defects may have a peak at the N– type layer 60. In the present case, the lifetime control region 50 may be formed at least at the N– type layer 60.

The lattice defects may be formed at a portion except for interfaces between the N columns 20 and the P columns 30 which configurate the SJ structure. In the present case, the leak current may be reduced.

Such changes and modifications are to be understood as being within the scope of the present invention as defined by the appended claims.

What is claimed is:

1. A semiconductor device comprising:
    a substrate that has a first conductivity type;
    a plurality of first columns that have the first conductivity type and a plurality of second columns that have a second conductivity type, wherein the plurality of first columns and the plurality of second columns are alternately arranged on the substrate in a planar direction of the substrate to configurate a super junction structure;
    a first electrode that is disposed on the super junction structure, that forms schottky junctions with the plurality of first columns, and that forms ohmic junctions with the plurality of second columns; and
    a second electrode that is disposed on the substrate on an opposite side of the super junction structure, wherein:
    the plurality of first columns and the plurality of second columns provide a plurality of diodes;
    the first electrode and the plurality of first columns provide a plurality of schottky barrier diodes;
    the plurality of diodes and the plurality of schottky barrier diodes are coupled in parallel between the first electrode and the second electrode;
    at least a part of the substrate and the super junction structure forms a lifetime control region, the lifetime control region including lattice defects;
    the lifetime control region has a first trap density that is greater than a second trap density of a similar substrate and super junction structure without lattice defects; and
    the lifetime control region has a first minority carrier lifetime that is less than a second minority carrier lifetime of the similar substrate and super junction structure without lattice defects.

2. The semiconductor device according to claim 1, wherein:
    each of the first columns includes a low concentration portion that is located on a side of the first electrode and the that has a low impurity concentration with respect to other portion of the first columns;
    the schottky junctions are formed by the first electrode and the low concentration portions; and
    the schottky barrier diodes are provided by the first electrode and the low concentration portions.

3. The semiconductor device according to claim 1, wherein:
    the substrate includes a low concentration layer that is located on a side of the super junction structure and that has a low impurity concentration with respect to other portion of the substrate; and
    the plurality of first columns has an impurity concentration that is greater than or equal to the impurity concentration of the low concentration layer.

4. The semiconductor device according to claim 3, wherein:
    each of the first columns includes a low concentration portion that is located on a side of the first electrode and the that has a low impurity concentration with respect to other portion of the first columns;
    the schottky junctions are formed by the first electrode and the low concentration portions; and
    the schottky barrier diodes are provided by the first electrode and the low concentration portions.

5. The semiconductor device according to claim 3, wherein a density of the lattice defects has a peak at the low concentration layer.

6. The semiconductor device according to claim 3, wherein the lifetime control region is provided at least at the low concentration layer.

7. The semiconductor device according to claim 1, wherein:
    each of the second columns includes a high concentration portion that is located on a side of the first electrode and the that has a high impurity concentration with respect to other portion of the second columns; and
    the ohmic junctions are formed by the first electrode and the high concentration portions.

8. The semiconductor device according to claim 1, further comprising:
    a pair of base regions that has the second conductivity type, that is disposed at a surface portion of the super junction structure, and that extends in a direction where the plurality of first columns and the plurality of second columns are alternatively arranged, wherein the first electrode is located between the pair of base regions, and each of the base regions has a surface portion including a first section, a second section, and a third section;
    a pair of source regions that has the first conductivity type and that is disposed at the first sections of the pair of base regions, respectively;
    a pair of body regions that has the second conductivity type, that has a high impurity concentration with respect to the pair of base regions, and that is disposed at the second sections of the pair of base regions, respectively;
    a pair of source electrodes each including a first part and a second part, wherein the first parts are disposed on the pair of source regions, respectively, and the second parts are disposed on the pair of body regions, respectively; and
    a pair of gate electrodes that is disposed on the third sections of the pair of base regions, respectively; wherein
    the third sections of the pair of base regions provide a pair of channel regions and are located between the pair of source regions and the plurality of first columns;
    the first electrode provides an anode electrode;
    the second electrode provides a cathode electrode and a drain electrode; and
    an electric current flows between the pair of source electrodes and the second electrode in accordance with a voltage applied to the pair of gate electrodes.

9. The semiconductor device according to claim 8, wherein:
    each of the first columns includes a low concentration portion that is located on a side of the first electrode and the that has a low impurity concentration with respect to other portion of the first columns;

the third sections of the pair of base regions are located between the pair of source regions and the low concentration portions;

the schottky junctions are formed by the first electrode and the low concentration portions; and the schottky barrier diodes are provided by the first electrode and the low concentration portions.

10. The semiconductor device according to claim 9, wherein:

the substrate includes a low concentration layer that is located on a side of the super junction structure and that has a low impurity concentration with respect to other portion of the substrate; and the plurality of first column has an impurity concentration that is greater than or equal to the impurity concentration of the low concentration layer.

11. The semiconductor device according to claim 1, wherein the lattice defects are distributed in a direction approximately perpendicular to the planar direction of the substrate.

12. The semiconductor device according to claim 11, wherein a density of the lattice defects has a peak at a portion of the super junction structure that is located on a side of the substrate.

13. The semiconductor device according to claim 1, wherein the lifetime control region is provided at least a portion of the super junction structure that is adjacent to the substrate.

14. The semiconductor device according to claim 1, wherein interfaces between the plurality of first columns and the plurality of second columns have no lattice defect.

15. The semiconductor device according to claim 1, wherein the lattice defects are provided by irradiating at least the part of the substrate and the super junction structure with a radiation.

16. The semiconductor device according to claim 15, wherein the radiation includes one of an electron beam and a neutron beam.

17. The semiconductor device according to claim 1, wherein the lattice defects are provided by irradiating at least the part of the substrate and the super junction structure with an ion beam.

18. The semiconductor device according to claim 17, wherein the ion beam includes one of proton and helium.

19. The semiconductor device according to claim 1, wherein:

the first trap density is about $1.5 \times 10^{12}$ cm$^{-3}$.

20. The semiconductor device according to claim 1, wherein:

the first minority carrier lifetime about $10^{-5}$ seconds.

* * * * *